(12) United States Patent
Ramaraju et al.

(10) Patent No.: US 8,487,656 B1
(45) Date of Patent: Jul. 16, 2013

(54) DYNAMIC LOGIC CIRCUIT

(75) Inventors: Ravindraraj Ramaraju, Round Rock, TX (US); George P. Hoekstra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/484,859

(22) Filed: May 31, 2012

(51) Int. Cl.
*H03K 19/096* (2006.01)

(52) U.S. Cl.
USPC .............................. 326/98; 326/112; 326/121

(58) Field of Classification Search
USPC ......................... 326/93, 95–98, 112, 119, 121
See application file for complete search history.

(56) References Cited

U.S. PATENT DOCUMENTS

| | | | |
|---|---|---|---|
| 5,852,373 A | 12/1998 | Chu et al. | |
| 6,002,292 A * | 12/1999 | Allen et al. | ................... 327/379 |
| 6,496,038 B1 | 12/2002 | Sprague et al. | |
| 6,549,038 B1 * | 4/2003 | Sechen et al. | ................... 326/93 |
| 6,559,680 B2 | 5/2003 | Bhushan et al. | |
| 6,791,365 B2 | 9/2004 | Bosshart | |
| 6,791,757 B2 | 9/2004 | Hobbs et al. | |
| 6,794,901 B2 | 9/2004 | Bernstein et al. | |
| 6,914,452 B2 | 7/2005 | Gauthier et al. | |
| 6,940,314 B1 | 9/2005 | Bloker et al. | |
| 6,996,686 B2 * | 2/2006 | Doblar et al. | ................... 711/157 |
| 7,109,757 B2 | 9/2006 | Yuan et al. | |
| 7,940,087 B1 * | 5/2011 | Weigl | ............................... 326/98 |
| 2004/0041590 A1 * | 3/2004 | Bernstein et al. | ................ 326/95 |
| 2008/0116938 A1 * | 5/2008 | Ngo et al. | ........................ 326/95 |
| 2008/0284469 A1 * | 11/2008 | Belluomini et al. | ............ 326/93 |

OTHER PUBLICATIONS

Weste et al.; "Circuit Families"; CMOS VLSI Design—A Circuits and Systems Perspective; Mar. 1, 2010; Cover Page, Table of Contents; 4 pgs.; Addison-Wesley.
U.S. Appl. No. 11/438,890, filed May 23, 2006.
Office Action mailed Mar. 18, 2013 in U.S. Appl. No. 13/484,870.

* cited by examiner

*Primary Examiner* — Don Le
(74) *Attorney, Agent, or Firm* — Joanna G. Chiu; James L. Clingan, Jr.

(57) ABSTRACT

A dynamic logic circuit includes an N channel transistor stack between a dynamic node and a first power terminal for receiving a plurality of logic signals. A first clock transistor is coupled between a second power terminal and the dynamic node for receiving a clock signal. A second clock transistor is in series with the N channel stack, between the dynamic node and a second power terminal, and for receiving the clock signal. An inverter circuit has an input coupled to the dynamic node and an output. A keeper transistor has a control electrode coupled to the output of the inverter circuit, a first current electrode coupled to the dynamic node, and a second current electrode. A plurality of P channel transistors, which are coupled in parallel, are coupled between the keeper transistor and the second power terminal and are for receiving the plurality of logic signals.

20 Claims, 2 Drawing Sheets

DYNAMIC LOGIC CIRCUIT

CROSS-REFERENCE TO RELATED APPLICATION(S)

This application is related to U.S. patent application Ser. No. 13/484,870, filed on even date, entitled "Dynamic Logic Circuit," naming George Hoekstra, Ravindraraj Ramaraju, and Maciej Bajkowski as inventors, and assigned to the current assignee hereof.

BACKGROUND

1. Field

This disclosure relates generally to dynamic logic circuits, and more specifically, to dynamic logic circuits with a keeper transistor.

2. Related Art

Dynamic logic circuits are typically used in applications requiring high speed operation. Dynamic logic circuits operate in accordance with a clock signal, in which, during a precharge phase of a clock cycle, the dynamic node of the dynamic logic circuit is precharged to a logic level high, and during a subsequent evaluate phase of the clock cycle, the dynamic logic circuit evaluates the logic inputs. As a result of the evaluation, the dynamic node may maintain the logic level high or be pulled down to a logic level low. A PMOS keeper circuit connected to the dynamic node of the dynamic logic circuit may be used to ensure that the dynamic node is never left floating. For example, during the evaluate phase of the clock, the keeper circuit ensures that the dynamic node does not float by feeding back an output signal of the dynamic logic circuit. However, if, during the evaluate phase of the clock, the inputs of the dynamic logic circuit cause the state of the dynamic node to be pulled low, the keeper circuit must be overcome in order to provide the correct output.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a dynamic logic circuit includes a P channel keeper transistor that is selectively disabled during the evaluate phase of a clock signal based on the values of logic input signals. For example, if the logic input signals to the dynamic logic circuit, during an evaluate phase, do not result in changing the precharged state of a dynamic node of the dynamic logic circuit, the P channel keeper transistor ensures that the dynamic node remains at the precharged state and does not become floating. However, if the logic input signals during the evaluate phase result in changing the precharged state of the dynamic node, the P channel keeper transistor is disabled such that no current is provided to the dynamic node by the P channel keeper transistor. In this manner, the changing of the precharged state of the dynamic node may occur without having to overcome the P channel keeper transistor. In one embodiment, as will be described below, the disabling of the P channel keeper transistor is performed by using a plurality of P channel transistors whose gates are coupled to the logic input signals to gate the power to the source of the P channel keeper transistor. Therefore, by selectively disabling the P channel keeper transistor dependent upon the values of the input signals, increased speed may be achieved.

Figure 1:
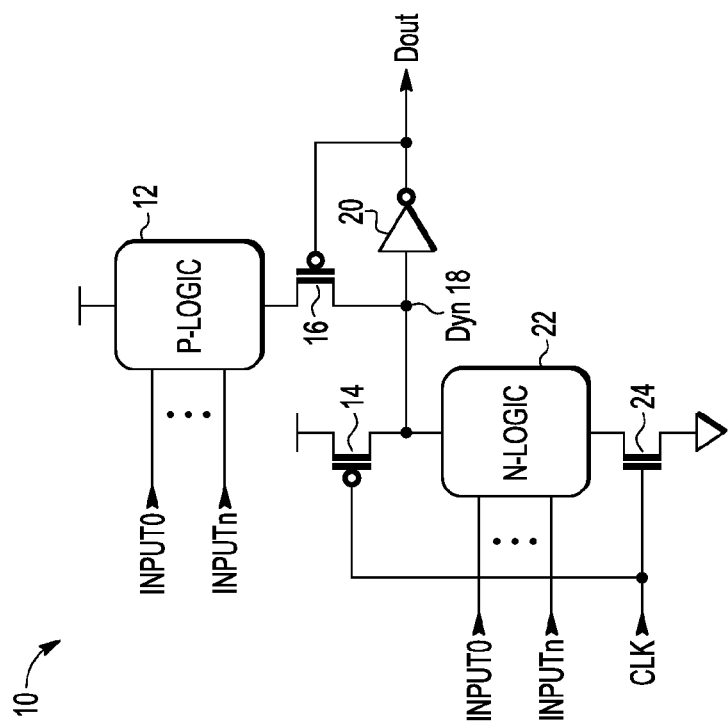
FIG. 1 illustrates, in partial schematic and partial block diagram form, a dynamic logic circuit in accordance with an embodiment of the disclosure.

FIG. 1 illustrates, in partial schematic and partial block diagram form, a dynamic logic circuit 10 in accordance with an embodiment of the present disclosure. Dynamic logic circuit 10 includes P channel transistors 14 and 16, inverter 20, N channel transistor 24, P-logic 12, and N-logic 22. P channel transistor 14 has a first current electrode connected to a first power supply voltage terminal, Vdd, and a gate connected to receive a clock signal, CLK. A second current electrode of transistor 14 is connected to a dynamic node (DYN) 18. N-logic 22 is connected between DYN 18 and a first current electrode of an N channel transistor 24, and a second current electrode of N channel transistor 24 is connected to ground. A gate of transistor 24 is connected to CLK. P-logic 12 is connected between Vdd and a first current electrode of a P channel transistor 16. A second current electrode of transistor 16 is connected to DYN 18. An input of inverter 20 is connected to DYN 18, and an output of inverter 20 is connected to a gate of transistor 16 and also provides an output, DOUT, of dynamic logic circuit 10. N-logic 22 receives n inputs, Input0-Inputn. P-logic 12 also receives Input0-Inputn. The value n can represent any integer greater than or equal to 2.

In operation, during a precharge phase of CLK, in which CLK is a logic level low, transistor 14 is on and transistor 24 is off. Therefore, DYN 18 is precharged to a logic level high by transistor 14. Inverter 20 outputs DOUT as a logic level low. Therefore, DOUT is precharged to a logic level low during the precharge phase. During the subsequent evaluate phase of CLK, in which CLK is a logic level high, the values of Input0-Inputn are evaluated by N-logic 22 which may result in DYN 18 staying at a logic level high or being pulled to a logic level low. That is, the value of DYN 18 (and thus DOUT) is based on the logic implemented by N-logic 22. In one embodiment, N-logic 22 includes one or more N channel transistor stacks, in which each N channel transistor stack includes a plurality of N channel transistors connected in series between DYN 18 and transistor 24, in which each transistor of the plurality of N channel transistors has a corresponding input of Input0-Inputn connected to its gate. Each stack of N channel transistors may be referred to as a NAND stack in which, during an evaluate phase of CLK, DYN 18 is pulled low by a NAND stack only when all inputs to the gates of the NAND stack are a logic level high. P-logic 12 includes n P channel transistors, in which a gate of each P channel transistor is connected to a corresponding input of Input0-Inputn. During the evaluate phase of CLK, when all inputs to the gates of a NAND stack are a logic level high, p-logic 12 operates to disconnect transistor 16 from Vdd such that DYN 18 can be pulled to a logic level low without having to overcome transistor 16. However, if during the evaluate phase none of the NAND stacks pull DYN 18 low, transistor 16 remains coupled to Vdd by P-logic 12 so as to ensure that DYN 18 does not float (since transistor 14 is off during the evaluate phase of CLK). Note that transistor 16 may be referred to as a keeper transistor or a P channel keeper transistor.

Figure 2:
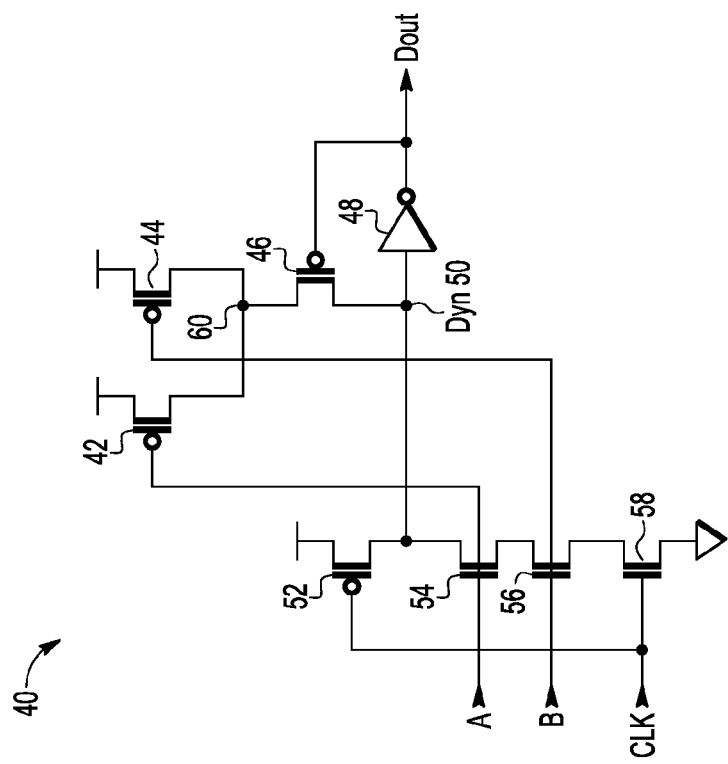
FIG. 2 illustrates, in schematic form, an exemplary implementation of the dynamic logic circuit of FIG. 1.

FIG. 2 illustrates a dynamic logic circuit 40 which provides an exemplary implementation of dynamic logic circuit 10 in which dynamic logic circuit 40 implements a dynamic AND function. Dynamic logic circuit 40 includes P channel transistors 42, 44, 46, and 52, N channel transistors 54, 56, and 58, and inverter 48. A first current electrode (e.g. source) of P channel transistor 42 is connected to a power supply terminal, Vdd, a gate of transistor 42 is connected to a first input logic signal, A, and a second current electrode (e.g. drain) of transistor 42 is connected to circuit node 60. A first current electrode (e.g. source) of P channel transistor 44 is connected to Vdd, a gate of transistor 44 is connected to a second input logic signal, B, and a second current electrode (e.g. drain) of transistor 44 is connected to current node 60. A first current electrode (e.g. source) of transistor 46 is connected to circuit node 60 and a second current electrode (e.g. drain) of transistor 46 is connected to dynamic circuit node (DYN) 50. A first input of inverter 48 is connected to DYN 50, and an output of inverter 48 is connected to a gate of transistor 46 and also provides an output, DOUT, of dynamic logic circuit 40. A first current electrode (e.g. source) of P channel transistor 52 is connected to Vdd, a second current electrode (e.g. drain) of P channel transistor 52 is connected to DYN 50, and a gate of P channel transistor 52 is connected to CLK. N channel transistor 54 has a first current electrode (e.g. drain) connected to DYN 50, and a gate connected to the first input logic signal, A. N channel transistor 56 has a first current electrode (e.g. drain) connected to a second current electrode (e.g. source) of transistor 54, and a gate connected to a second input logic signal, B. N channel transistor 58 has a first current electrode (e.g. drain) connected to a second current electrode (e.g. source) of transistor 56, a gate connected to CLK, and a second current electrode (e.g. source) connected to ground.

Note that transistors 52, 58, and 46 are analogous to transistors 14, 24, and 16 of FIG. 1, and that transistor 46 may also be referred to as a keeper transistor or P channel keeper transistor. Transistors 54 and 56 are an exemplary implementation of N-logic 22, in which transistors 54 and 56 form an N channel transistor stack or a NAND stack. Transistors 42 and 44 are an exemplary implementation of P-logic 12. Also, dynamic logic circuit 40 implements a dynamic AND gate such that DOUT, during the evaluate phase of CLK, provides the result of the logical AND of A and B.

In operation, during a precharge phase of CLK, in which CLK is a logic level low, transistor 52 is on and transistor 58 is off. Therefore, DYN 50 is precharged to a logic level high by transistor 52. Inverter 48 outputs DOUT as a logic level low. Therefore, DOUT is precharged to a logic level low during the precharge phase. During the subsequent evaluate phase of CLK, in which CLK is a logic level high, the values of input signals A and B are evaluated, which may result in a change of state of DYN 50. If only one of A or B are a logic level high (meaning at least one of A or B is a logic level low) or if both A and B are a logic level low, DYN 50 remains at its precharge state of a logic level high. In this case, at least one of P channel transistors between node 60 and Vdd is on. Therefore, the first current electrode of keeper transistor 46 is coupled to Vdd and the gate of transistor 46, which receives the logic level low at the output of inverter 48, remains conductive and maintains DYN 50 at a logic level high. This ensures that DYN 50 does not float (since transistor 52 is off during the evaluate phase). However, if both A and B are at a logic level high during the evaluate phase, DYN 50 is pulled low by the path to ground created by transistors 54, 56, and 58 all being on. In this case, since both A and B are a logic level one, both transistors 42 and 44 are off, thus decoupling the first current electrode of transistor 46 from Vdd and disabling transistor 46. In this manner, DYN 50 can be more quickly pulled low as compared to the situation in which transistor 46 remains enabled because there is no contention between the pull down path through transistors 54, 56, and 58 and pull-up transistor 46. Therefore, in the illustrated embodiment, power to keeper transistor 46 is selectively gated based on A and B. That is, the enabling and disabling of the keeper transistor is controlled based on the actual values of the input logic signals.

In one embodiment, transistors 52 and 58, which receive CLK, may be referred to as a clock circuit which enables an output of the transistors 54 and 56 to be coupled to DYN 50 when CLK is an evaluate phase (since transistor 58 is on and transistor 52 is off during this phase) and to decouple the output of the transistors 54 and 56 from DYN 50 when CLK is in a precharge phase (since transistor 58 is off and transistor 52 is on).

In one embodiment, transistors 42 and 44 (or P-logic 12) may be referred to as a keeper circuit coupled to the keeper transistor, such as transistor 46, which asserts a keeper signal (such as at circuit node 60) responsive to logic signals (e.g. A and B) to retain the precharged state on DYN 50 when the logic signals indicate that DYN 50 is to be in the precharged state (such as when both A and B are not a logic level one) and to block the keeper signal at circuit node 60 from the keeper transistor for the case when DYN 50 switches from the precharged state to a different state (such as when both A and B are a logic level one). If the keeper signal is asserted, then power is provided to keeper transistor 46; however, when the keeper signal is blocked, power is not provided to keeper transistor 46. Therefore, note that DYN 50 is held in the precharge state by keeper transistor 46 by applying Vdd through at least one of parallel P channel transistors 42 and 44 during the evaluate phase of the CLK unless a first combination of A and B is received during the evaluate phase. For example, if the combination of both A and B is one is received, DYN 50 is not held at the precharge state by keeper transistor 46 since Vdd is decoupled from transistor 46 in which this decoupling is performed responsive to A and B. In this manner, DYN 50 is allowed to change states. However, if this combination is not received, then DYN 50 is held in the precharge state by keeper transistor 46 which is coupled to Vdd.

Figure 3:
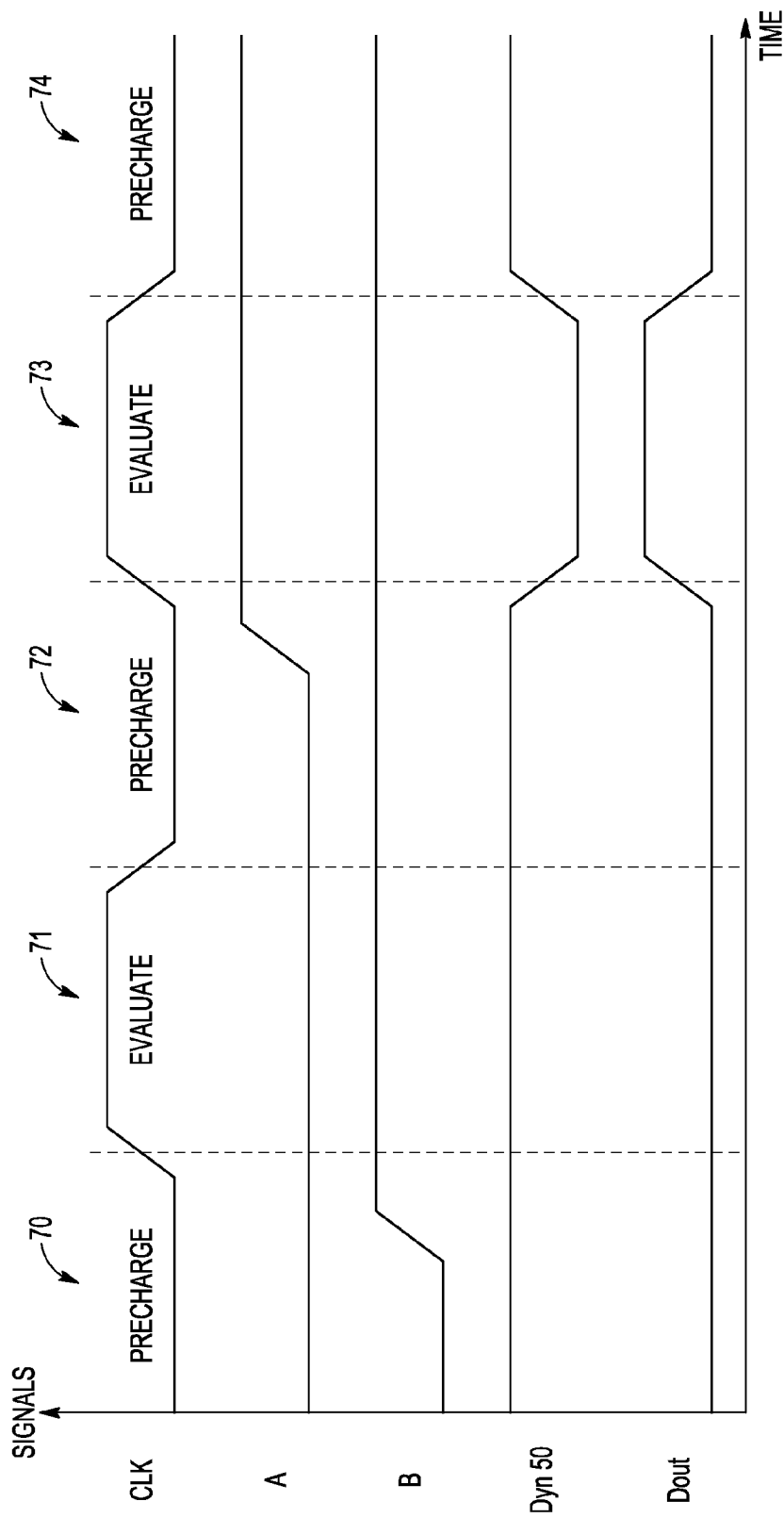
FIG. 3 illustrates a plurality of waveforms corresponding to various signals of the dynamic logic circuit of FIG. 2.

FIG. 3 illustrates example waveforms for various signals or nodes of dynamic logic circuit 40. During a first precharge phase 70 of CLK, DYN 50 is precharged to a logic level high and DOUT is therefore precharged to a logic level low. The value of A is a logic level zero, and the value of B, at some point in time prior to a subsequent evaluate phase 71 of CLK, is a logic level one. Note that B transitions from a logic level zero to a logic level one with a sufficient amount of time prior to the rising edge of CLK. That is, a sufficient setup time must be provided between a valid value of input signal A and B and the rising edge of CLK. During evaluate phase 71, since A is a logic level 0, DYN 50 remains a logic level high and DOUT remains a logic level low. Also, since A is a logic level 0, transistor 42 is on, thus enabling keeper transistor 46, via inverter 48, to maintain DYN 50 at a logic level high.

During a second precharge phase 72 of CLK, DYN 50 is again precharged to a logic level high, and DOUT to a logic level low. Input logic signal A, at some point in time during precharge phase 72 and prior to a subsequent evaluate phase 73, switches to a logic level one. Therefore, during evaluate phase 73, since both A and B are at logic level ones, transistors 54 and 56 are both on. In this manner, since CLK is a logic level one as well, a pull-down path is created by transistors 54, 56, and 58. Also, both of transistors 42 and 44 are turned off, thus disabling keeper transistor 46. DYN 50 is therefore pulled to a logic level low and DOUT switches to a logic level one. Note that since keeper transistor 46 is disabled during the evaluate phase, DYN 50 can be pulled down by transistors 54, 56, and 58 without needing to overcome transistor 46. During a third precharge phase 74 of CLK, DYN 50 is again precharged to a logic level high in preparation for a subsequent evaluate phase.

In an alternate embodiment, dynamic logic circuit 40 may include one or more additional inputs, such as C, which can be provided to the gate of an additional N channel transistor connected in series with transistors 54 and 56 and to the gate of an additional P channel transistor connected in parallel with transistors 42 and 44. In this example, the evaluation of DOUT would correspond to the logical AND of inputs A, B, and C.

Note that in the implementation of FIG. 2, each of input signals A and B are additionally loaded by a P channel transistor (transistor 42 and 44, respectively). However, even taking into consideration the additional capacitance which may be introduced by the transistors 42 and 44, the selective removal or decoupling of power from keeper transistor during the evaluate phase based on the actual values of A and B may result in improved speed by removing contention with the keeper transistor. Therefore, note that P-logic may include P channel transistors which operate to selectively decouple power from the keeper transistor during the evaluate phase based on the values of the input logic signals (in which the input logic signals are those signals which determine the value of DOUT).

As used herein, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Although the invention is described herein with reference to specific embodiments, various modifications and changes can be made without departing from the scope of the present invention as set forth in the claims below. For example, dynamic logic circuit 10 may implement a variety of different logic functions other than a dynamic AND. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a dynamic logic circuit, including an N channel transistor stack between a dynamic node and a first power supply terminal for receiving a plurality of logic signals; a P channel clock transistor coupled between a second power supply terminal and the dynamic node for receiving a clock signal; an N channel clock transistor in series with the N channel transistor stack and between the dynamic node and the first power supply terminal for receiving the clock signal; an inverter circuit having an input coupled to the dynamic node and an output; a keeper transistor having a control electrode coupled to the output of the inverter circuit, a first current electrode coupled to the dynamic node, and a second current electrode; and a plurality of P channel transistors in parallel coupled between the second current electrode of the keeper transistor and the second power supply terminal, wherein the plurality of P channel transistors are for receiving the plurality of logic signals. Item 2 includes the dynamic logic circuit of item 1, wherein the N channel transistor stack includes a first N channel transistor having a drain coupled to the dynamic node, a gate for receiving a first logic signal of the plurality of logic signals, and a source; and a second N channel transistor having a drain connected to the source of the first N channel transistor, a gate for receiving a second logic signal, and a source coupled to the N channel clock transistor. Item 3 includes the dynamic logic circuit of item 2, wherein the N channel clock transistor has a drain coupled to the source of the second N channel transistor, a gate for receiving the clock signal, and source coupled to the first power supply terminal. Item 4 includes the dynamic logic circuit of item 3, wherein the P channel clock transistor has a source connected to the second power supply terminal, a gate for receiving the clock signal, and a drain connected to the dynamic node. Item 5 includes the dynamic logic circuit of item 4, wherein the plurality of P channel transistors includes a first P channel transistor having a source coupled to the second power supply terminal, a gate for receiving the first logic signal, and a drain coupled to the second current electrode of the keeper transistor; and a second P channel transistor having a source coupled to the second power supply terminal, a gate for receiving the second logic signal, and a drain coupled to the second current electrode of the keeper transistor. Item 6 includes the dynamic logic circuit of item 5, wherein the N channel transistor stack further includes a third N channel transistor coupled in series with the first and second N channel transistors, wherein the third N channel transistor is for receiving a third logic signal. Item 7 includes the dynamic logic circuit of item 6, wherein the plurality of P channel transistors further includes a third P channel transistor having a first current electrode coupled to the second power supply terminal, a control electrode for receiving the third logic signal, and a second current electrode coupled to the second current electrode of the keeper transistor. Item 8 includes the dynamic logic circuit of item 1, wherein the keeper transistor is a P-type transistor. Item 9 includes the dynamic logic circuit of item 1, wherein the keeper transistor is directly connected to the dynamic node. Item 10 includes the dynamic logic circuit of item 1, wherein the keeper transistor is for keeping the dynamic node from floating during an evaluation period of the clock signal for a first logic condition of the dynamic node and for being non-conductive during the evaluation period of the clock signal for a second logic condition of the dynamic node.

Item 11 includes a dynamic logic circuit for providing an output representative of a combination of a logic signals, including a first plurality of transistors for receiving the logic signals; a clock circuit for enabling an output of the first plurality of transistors to be coupled to a dynamic node when a clock signal is in an evaluation phase and to decouple the output of the first plurality of transistors from the dynamic node when the clock signal is in a precharge phase; a keeper transistor coupled to the dynamic node; an inverter having an input coupled to the dynamic node and an output for enabling the keeper transistor when the dynamic node is in a first logic state and disabling the keeper transistor when the dynamic node is in a second logic state; and a keeper control circuit coupled to the keeper transistor for asserting a keeper signal to the keeper transistor responsive to logic signals to retain the first logic state on the dynamic node when the logic signals indicate that the dynamic node is to be in the first logic state and for blocking the keeper signal from the keeper transistor for the case of the dynamic node switching from the first logic state to the second logic state. Item 12 includes the dynamic logic circuit of item 11, wherein the first plurality of transistors are in series between the dynamic node and a first power supply terminal. Item 13 includes the dynamic logic circuit of item 12, wherein the first plurality of transistors include N channel transistors in which each transistor of the first plurality of transistors receives a unique one of the logic signals. Item 14 includes the dynamic logic circuit of item 13, wherein the keeper control circuit includes a second plurality of transistors, wherein the second plurality of transistors include P channel transistors in parallel between a second power supply terminal and the keeper transistor. Item 15 includes the dynamic logic circuit of item 14, wherein each transistor of the second plurality of transistors has a corresponding transistor in the first plurality of transistors and receives the same logic signal as the corresponding transistor receives. Item 16 includes the dynamic logic circuit of item 15, wherein the keeper transistor is a P channel transistor having a source coupled to the second plurality of transistors. Item 17 includes the dynamic logic circuit of item 16, wherein the clock circuit includes an N channel transistor coupled in series with the first plurality of transistors and has a gate for receiving the clock signal.

Item 18 includes a method of operating a dynamic circuit, including precharging a dynamic node during a precharge phase of a clock to a first logic state; holding the dynamic node in the first logic state by applying power to a keeper transistor coupled to the dynamic node during an evaluation phase of the clock unless a first combination of logic signals is received during the evaluation phase; and if the first combination of logic signals is received during the evaluation phase: decoupling power from the keeper transistor responsive to the logic signals, and switching the dynamic node to a second logic state. Item 19 includes the method of item 18, wherein holding the dynamic node in the first logic state is further characterized by keeping the keeper transistor conductive when the dynamic node is in the first logic state. Item 20 includes the method of item 19, wherein the dynamic node includes causing the keeper transistor to become non-conductive.

What is claimed is:

1. A dynamic logic circuit, comprising:
   an N channel transistor stack between a dynamic node and a first power supply terminal for receiving a plurality of logic signals;
   a P channel clock transistor coupled between a second power supply terminal and the dynamic node for receiving a clock signal;
   an N channel clock transistor in series with the N channel transistor stack and between the dynamic node and the first power supply terminal for receiving the clock signal;
   an inverter circuit having an input coupled to the dynamic node and an output;
   a keeper transistor having a control electrode coupled to the output of the inverter circuit, a first current electrode coupled to the dynamic node, and a second current electrode; and
   a plurality of P channel transistors in parallel coupled between the second current electrode of the keeper transistor and the second power supply terminal, wherein the plurality of P channel transistors are for receiving the plurality of logic signals.

2. The dynamic logic circuit of claim 1, wherein the N channel transistor stack comprises:
   a first N channel transistor having a drain coupled to the dynamic node, a gate for receiving a first logic signal of the plurality of logic signals, and a source; and
   a second N channel transistor having a drain connected to the source of the first N channel transistor, a gate for receiving a second logic signal, and a source coupled to the N channel clock transistor.

3. The dynamic logic circuit of claim 2, wherein the N channel clock transistor has a drain coupled to the source of the second N channel transistor, a gate for receiving the clock signal, and source coupled to the first power supply terminal.

4. The dynamic logic circuit of claim 3, wherein the P channel clock transistor has a source connected to the second power supply terminal, a gate for receiving the clock signal, and a drain connected to the dynamic node.

5. The dynamic logic circuit of claim 4, wherein the plurality of P channel transistors comprises:
   a first P channel transistor having a source coupled to the second power supply terminal, a gate for receiving the first logic signal, and a drain coupled to the second current electrode of the keeper transistor; and
   a second P channel transistor having a source coupled to the second power supply terminal, a gate for receiving the second logic signal, and a drain coupled to the second current electrode of the keeper transistor.

6. The dynamic logic circuit of claim 5, wherein the N channel transistor stack further comprises a third N channel transistor coupled in series with the first and second N channel transistors, wherein the third N channel transistor is for receiving a third logic signal.

7. The dynamic logic circuit of claim 6, wherein the plurality of P channel transistors further comprises a third P channel transistor having a first current electrode coupled to the second power supply terminal, a control electrode for receiving the third logic signal, and a second current electrode coupled to the second current electrode of the keeper transistor.

8. The dynamic logic circuit of claim 1, wherein the keeper transistor is a P-type transistor.

9. The dynamic logic circuit of claim 1, wherein the keeper transistor is directly connected to the dynamic node.

10. The dynamic logic circuit of claim 1 wherein the keeper transistor is for keeping the dynamic node from floating during an evaluation period of the clock signal for a first logic condition of the dynamic node and for being non-conductive during the evaluation period of the clock signal for a second logic condition of the dynamic node.

11. A dynamic logic circuit for providing an output representative of a combination of a logic signals, comprising:
   a first plurality of transistors for receiving the logic signals;
   a clock circuit for enabling an output of the first plurality of transistors to be coupled to a dynamic node when a clock signal is in an evaluation phase and to decouple the output of the first plurality of transistors from the dynamic node when the clock signal is in a precharge phase;
   a keeper transistor coupled to the dynamic node;
   an inverter having an input coupled to the dynamic node and an output for enabling the keeper transistor when the dynamic node is in a first logic state and disabling the keeper transistor when the dynamic node is in a second logic state; and
   a keeper control circuit coupled to the keeper transistor for asserting a keeper signal to the keeper transistor responsive to logic signals to retain the first logic state on the dynamic node when the logic signals indicate that the dynamic node is to be in the first logic state and for blocking the keeper signal from the keeper transistor for the case of the dynamic node switching from the first logic state to the second logic state.

12. The dynamic logic circuit of claim 11, wherein the first plurality of transistors are in series between the dynamic node and a first power supply terminal.

13. The dynamic logic circuit of claim 12, wherein the first plurality of transistors comprise N channel transistors in which each transistor of the first plurality of transistors receives a unique one of the logic signals.

14. The dynamic logic circuit of claim 13, wherein the keeper control circuit comprises a second plurality of transistors, wherein the second plurality of transistors comprise P channel transistors in parallel between a second power supply terminal and the keeper transistor.

15. The dynamic logic circuit of claim 14, wherein each transistor of the second plurality of transistors has a corresponding transistor in the first plurality of transistors and receives the same logic signal as the corresponding transistor receives.

16. The dynamic logic circuit of claim 15, wherein the keeper transistor is a P channel transistor having a source coupled to the second plurality of transistors.

17. The dynamic logic circuit of claim 16, wherein the clock circuit comprises an N channel transistor coupled in series with the first plurality of transistors and has a gate for receiving the clock signal.

18. A method of operating a dynamic circuit, comprising:
   precharging a dynamic node during a precharge phase of a clock to a first logic state;
   holding the dynamic node in the first logic state by applying power to a keeper transistor coupled to the dynamic node during an evaluation phase of the clock unless a first combination of logic signals is received during the evaluation phase; and
   if the first combination of logic signals is received during the evaluation phase:
      decoupling power from the keeper transistor responsive to the logic signals, and
      switching the dynamic node to a second logic state.

19. The method of claim 18, wherein holding the dynamic node in the first logic state is further characterized by keeping the keeper transistor conductive when the dynamic node is in the first logic state.

20. The method of claim 19, wherein the dynamic node includes causing the keeper transistor to become non-conductive.

\* \* \* \* \*